(12) United States Patent
Kappes

(10) Patent No.: US 6,714,062 B2
(45) Date of Patent: Mar. 30, 2004

(54) METHOD AND APPARATUS FOR A LIMITING AMPLIFIER WITH PRECISE OUTPUT LIMITS

(75) Inventor: Mike Kappes, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/435,779

(22) Filed: May 12, 2003

(65) Prior Publication Data

US 2003/0210086 A1 Nov. 13, 2003

Related U.S. Application Data

(63) Continuation of application No. 10/104,654, filed on Mar. 22, 2002, now Pat. No. 6,563,361.

(51) Int. Cl.[7] .................................................. H03L 5/00
(52) U.S. Cl. ........................................ 327/321; 327/309
(58) Field of Search ................................ 327/309, 310, 327/313, 317, 318, 319, 321, 322, 324, 327, 328, 333

(56) References Cited

U.S. PATENT DOCUMENTS 6,621,321 B2 * 9/2003 Goldstein et al. ........... 327/321

* cited by examiner

Primary Examiner—Jeffrey Zweizig
(74) Attorney, Agent, or Firm—James Harrison; Bruce Garlick; Tim Markison

(57) ABSTRACT

A circuit and a method for limiting a voltage to a specified value (e.g., a rail voltage) without clipping thereby includes a pair of MOSFETs that turn on when a specified bias voltage is reached to either add to or sink current from the input node of the resistive load responsive to fluctuations in current going through the output resistive load to maintain a constant current through it. A plurality of biasing circuits is provided that control the turn on voltage levels for the MOSFETs to achieve the desired operation. The biasing circuits include circuit components that are matched to circuit components within the circuitry that adds and drains current to the output resistive load including a resistive load that matches the output resistive load.

14 Claims, 6 Drawing Sheets

# METHOD AND APPARATUS FOR A LIMITING AMPLIFIER WITH PRECISE OUTPUT LIMITS

CROSS REFERENCE TO RELATED APPLICATION

This application is a continuation of and claims priority to U.S. application Ser. No. 10/104,654, filed Mar. 22, 2002, now U.S. Pat. No. 6,563,361 having a of "Method and Apparatus for a Limiting Amplifier with Precise Output Limits" which application is incorporated herein by reference in its entirety for all purposes.

BACKGROUND

1. Field of the Invention

The present invention relates to wireless communications and, more particularly, to signal filtering and voltage limiter circuits for use in a wideband wireless communication systems.

2. Description of the Related Art

Super-heterodyne receivers traditionally receive a Radio Frequency (RF) signal that must be converted to baseband by way of an intermediate frequency (IF). Thereafter, the IF signal is amplified. In a transmitter, similarly, a baseband signal often is up converted to the intermediate frequency wherein the amplification and subsequent filtering are carried out at the IF stages. While some narrow band systems skip the IF conversion step, wideband systems typically require conversion to IF stages. Depending on the signal bandwidth and the type of communication system, most semiconductor devices are not yet able to allow full integration of active filters operating at the elevated intermediate frequencies for a wideband or high data rate communication network.

Some narrow band or low data rate systems, such as Bluetooth, use a low intermediate frequency design approach. This approach is advantageous in that it facilitates the design of the IF portion of a radio on the integrated circuit device thereby allowing the development of low power circuitry that can be placed in new applications not seen before. Many transceiver devices utilize principles of frequency discrimination in order to facilitate the frequency spectrum being used by a plurality of users. Known frequency discrimination techniques include older systems that dedicate at least one frequency for a communication link between two wireless transceivers while other systems use a combination of time and frequency discrimination. One example of such system is the North American Time Division Multiple Access (TDMA) scheme in which communication slots are characterized by frequency and time in relation to a synchronization signal. Other known radio systems include Global System for Mobile Communications (GSM) wireless communication systems that also are TDMA-based systems.

These communication systems, as they become more popular, tend to experience greater levels of interference from other users, as well as from environmental conditions. For example, multi-path interference results in part from the. reflection of signals off of physical structures, which reflections interfere with the primary signal. Additionally, electronic noise sources also create interference. Because of the noisy environments that therefore exist in the wireless communication mediums, radios are built to include multiple processing steps to extract and purify a signal.

For example, a Bluetooth radio transmits a communication signal with a 2.4 GHz center frequency and with a 1 MHz band. Because radios actually process the data at baseband, however, such Bluetooth systems typically down convert from the transmission frequency of 2.4 GHz to an intermediate frequency prior to converting the signals down to baseband. Additionally, while the signals are at the intermediate frequency stage, significant processing occurs to eliminate noise and interference prior to converting the signals to baseband. Thus, because of frequency drift and other known problems, the signals are mixed with a local oscillator prior to conversion to baseband. Careful signal processing at this intermediate frequency stage allows for the greatest signal-to-noise ratio and therefore the purist signal for processing at the baseband level once the final conversion step occurs.

As a part of reconstructing the signal at the intermediate frequency stage, an amplifier is used for significantly amplifying very low voltage signals that are received so that they may be processed. To accurately determine the signal frequency and to reconstruct it, however, the rising and falling edges of the signal should be determined as precisely as possible.

Generally, signals are amplified for processing using one of several different amplifiers. Limiting amplifiers are sometimes used because they are operable to amplify a signal to reach and (perhaps exceed) a specified voltage or gain level. One problem with the majority of known limiting amplifiers, however, is that they have a coarse level of control of the final output amplitude. Most limiting amplifiers merely amplify a detected and received signal to a maximum value and then allow the amplified signal to clip at a specified value. While this design approach is acceptable for many systems, such a design approach has the adverse affect of causing the output stages of the amplifiers to cut off while a signal is being clipped. Accordingly, once the clipping terminates, a response period is required for the output stages of the amplifier to become present and operational again. Thus, an overload voltage range can result in quantization failures. There is a need, therefore, for a limiting amplifier in a wireless transceiver system that provides a precise output limit in the final amplification stages that maximizes the amplification of the signal while avoiding clipping and the adverse effects therefrom.

SUMMARY OF THE INVENTION

The present invention provides a circuit formed within a low power CMOS integrated circuit and a method for limiting a voltage to a specified value (e.g., a rail voltage) without clipping, thereby avoiding the undesirable consequences that result from clipping such as turn off of the output stage amplifiers. In general, a circuit is provided that adds current or removes current from an output resistive load so that the output voltage developed across the load will remain within defined limits. More specifically, in one embodiment of the invention, a Boll and Cascode configuration is used to steer the current in and out of the resistive load. A pair of Metal Oxide Semiconductor Field Effect Transistors (MOSFETs) is biased to turn on when a specified output voltage is reached to either add to or sink current from the input node of the resistive load thereby maintaining the output voltage in a predefined range. A plurality of biasing circuits is provided that control the turn on voltage levels for the MOSFETs to achieve the desired operation.

In general, the invention includes a differential MOSFET pair configuration that provide current amplification that are connected to steering circuitry for steering current in and out of the resistive load coupled across the differential MOSFET pair. The steering circuitry then is coupled to receive biasing signals from biasing circuitry that sets the upper and lower rail voltage limits. As such, current is removed (steered out of the resistive load) when an amplified signal is tending to exceed an upper rail voltage limit as defined by a first bias signal. Conversely, current is added (steered into the resistive load) when an amplified signal is tending to exceed a lower rail voltage limit as defined by a second bias signal. The biasing circuits include circuit components that are matched to circuit components within the voltage limiting circuitry to add and remove current to the output resistive load. The biasing circuits each further include a replica resistive load (resistor in one embodiment of the invention) that matches the output resistive load. Accordingly, the accuracy of the output saturation limits of the amplifier can be precisely controlled to better than 1% variation with the described circuitry. This control of the output leads to a more optimal system design as the following stages can be optimized without requiring significantly extra dynamic range. Subsequently the receiver system can be made more robust.

Other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
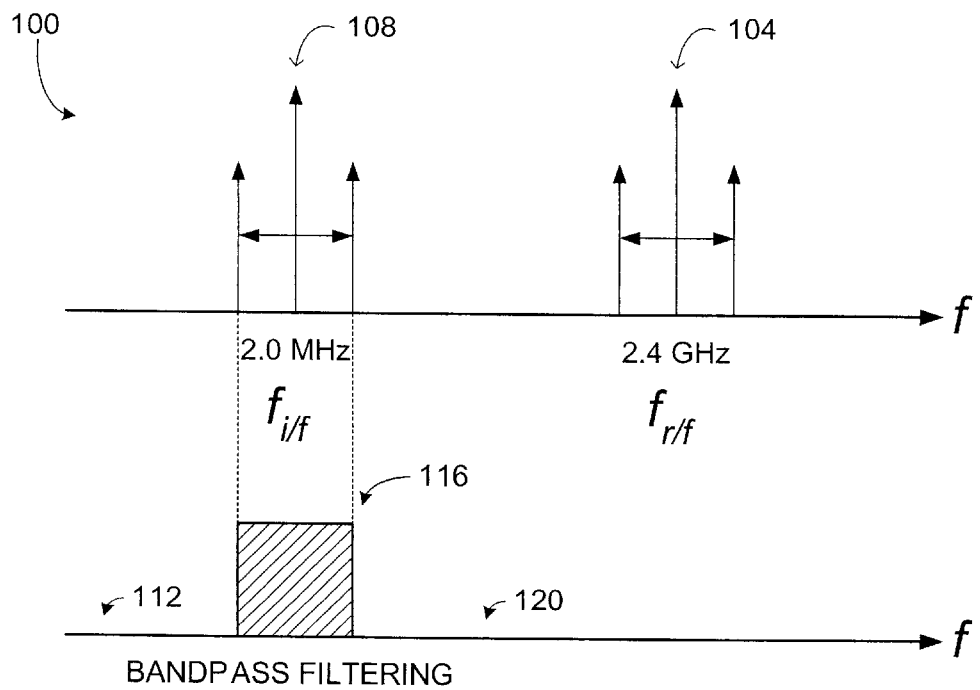
FIG. 1 is a frequency response diagram that illustrates signal processing according to one aspect of the present invention.

Generally, the present invention provides the circuitry and method for limiting an output voltage of an amplifier to a rail voltage amplitude without clipping. Along these lines, FIG. 1 is a frequency response diagram that illustrates signal processing according to one aspect of the present invention. Referring now to FIG. 1, a set of signal frequency response diagrams shown generally at 100 illustrates that the frequency of transmission for a signal, for one embodiment of the present invention, is a 2.4 GHz center channel frequency with a 1.0 MHz bandwidth. As may also be seen, the transmission signals, shown generally at 104 are down converted to an intermediate frequency shown generally at 108. In the described embodiment of the invention, the center channel of the intermediate frequency is 2.0 MHz. Again, the intermediate frequency signals define a 1.0 MHz bandwidth channel. As may also be seen from examining FIG. 1, the intermediate frequency is processed by bandpass filtering circuitry to define three signal areas. Signal area 112 includes the filtered signals prior to the intermediate frequency, while an area at 116 shows the non-filtered signals, namely, the intermediate frequency stage signals. And, finally, the area shown generally at 120 shows the filtered signals for all frequencies above 2.5 MHz. Thus, what the bottom signal frequency response curve illustrates is the use of bandpass filtering to only pass the signal after being down converted to the intermediate frequency having a center channel frequency of 2.0 MHz.

Figure 2:
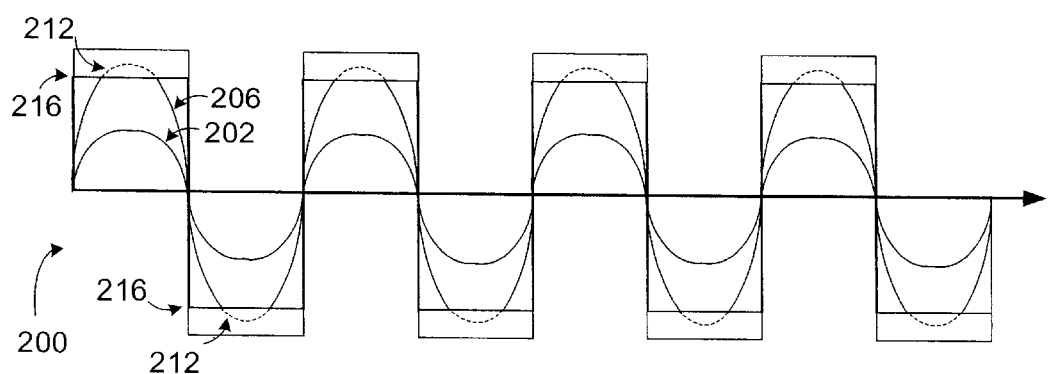
FIG. 2 is a signal diagram that illustrates a relationship between a received signal experiencing clipping in relation to a reconstructed signal according to one embodiment of the present invention.

FIG. 2 is a signal diagram that illustrates a relationship between a received signal experiencing clipping in relation to a reconstructed signal according to one embodiment of the present invention. Referring now to the signal diagram shown generally at 200, a received signal 202 experiences significant attenuation and interference during transmission.

The amplitude of a signal 206 is above a specified maximum shown generally at 216. The "dashed" portion of the pulses shown generally at 212 represent a possible amplitude value that is clipped due to either signal limiting or amplifier clipping. In many present designs, the signal amplitudes are allowed to clip at a specified value thereby preventing the signal from attaining the amplitude illustrated by the "dashed" portion of the pulses shown generally at 212. In the present invention, signal limiter circuitry is formed to obtain the maximum amplitude, shown generally at 216, while avoiding clipping as is illustrated for amplified signal 206.

Figure 3:
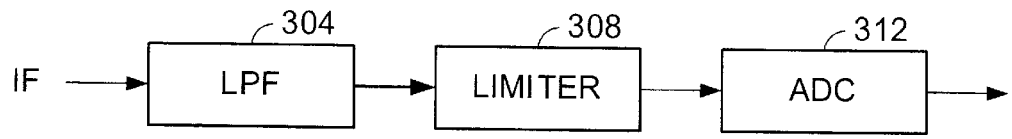
FIG. 3 is a functional block diagram that illustrates a signal processing system formed according to one embodiment of the present invention.

FIG. 3 is a functional block diagram that illustrates a signal processing system formed according to one embodiment of the present invention. Initially, a low pass filter 304 receives either an intermediate frequency or radio frequency signal that has been amplified some as a part of reconstructing the signal. In one embodiment of the present invention, low pass filter 304 provides a specified amount of gain as well as a low noise amplifier (not shown in FIG. 3) that is coupled to receive the RF from an antenna. Some radio receiver designs include the low noise amplifier, the mixer to down convert the signal, a low pass filter and a variable gain amplifier to amplify the received signal to 0 dBm. The present invention, however, includes voltage limiter circuitry in place of the variable gain amplifiers to provide a maximum amount of amplification to a specified rail voltage.

More specifically, the low pass filter receives an input signal (in the described embodiment, it receives an output from a mixer although that is not required). The output of low pass filter 304 is then produced to a limiter 308 that allows the signal to be amplified to the rail voltage levels without clipping. The output of limiter 308 is then produced to an analog-to-digital converter (ADC) 312, which converts the received analog signals to a digital domain for processing. Because many ADCs are very sensitive to overload, any clipping that occurs within the amplifier and limiter stages can introduce errors and create instability in ADC 312. According to one aspect of the present invention, therefore, limiter 308 is designed to allow the rail voltages to be obtained without clipping.

Figure 4:
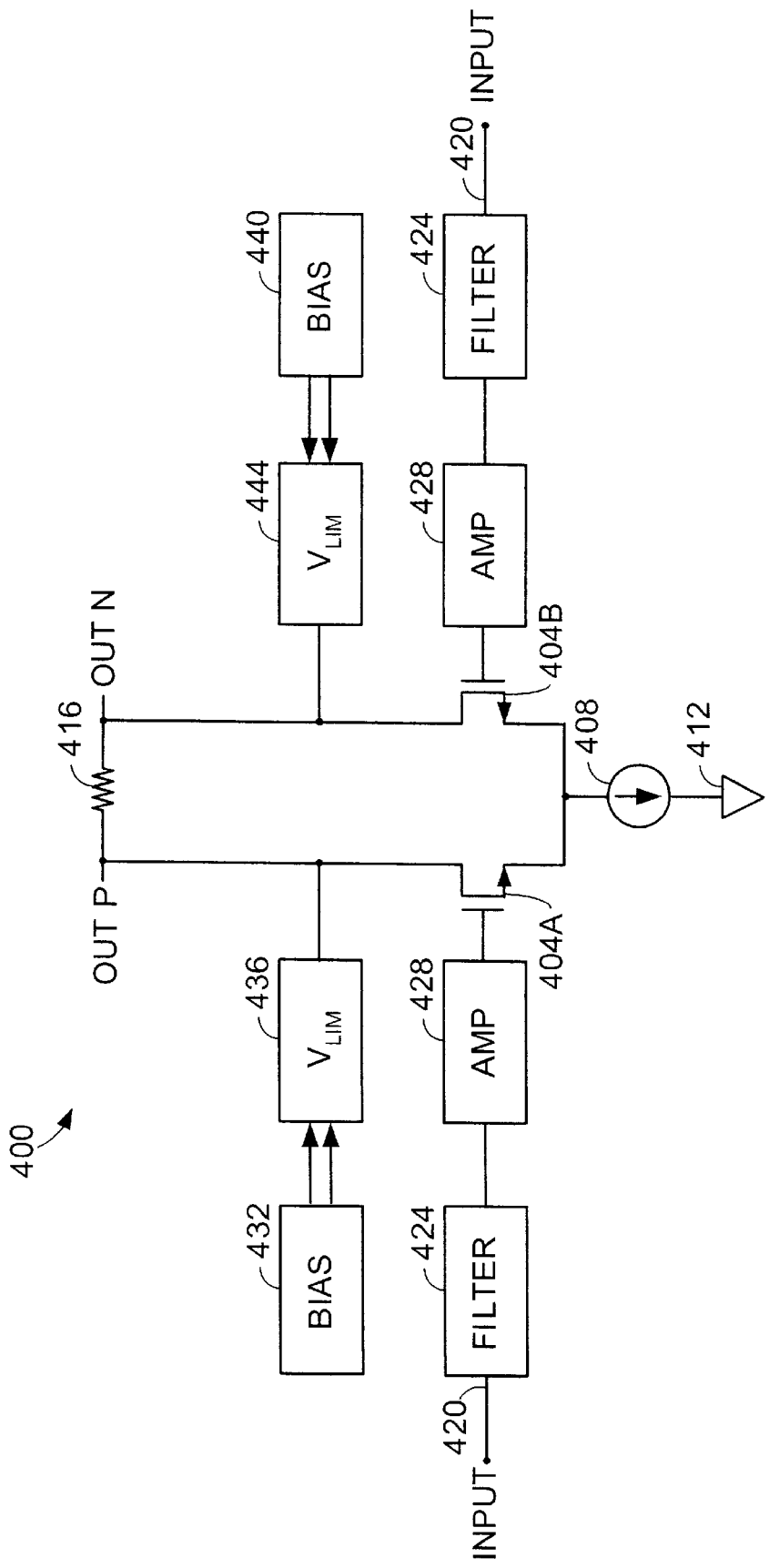
FIG. 4 is a functional schematic diagram of an intermediate frequency signal processing system that includes voltage limitation circuitry formed according to one embodiment of the present invention.

FIG. 4 is a functional schematic diagram of an intermediate frequency signal processing system that includes voltage limitation circuitry formed according to one embodiment of the present invention. The signal processing circuitry shown generally at 400 includes a differential amplifier pair that includes two MOSFETs 404A and 404B. The differential amplifier pair is coupled to a current source 408 that sinks (drives) a constant current to a ground 412. The output of the differential amplifier pair is coupled to an output port to which a resistive load 416 is coupled.

Generally, each of the two MOSFETs 404A and 404B control current flow as a function of the gate voltage provided by amplifiers 428. The output of amplifiers 428, however, will fluctuate due to amplitude fluctuation of the received analog signal. It is difficult, therefore, to produce an amplified analog signal whose peak amplitude is as large as possible but does not exceed the rail voltage because of signal amplitude fluctuations. A peak analog output value will introduce clipping (which is undesirable because it causes output amplifier stages to cut off during the clipping) unless voltage limiting is employed as is provided by the invention and the circuit shown here in FIG. 4.

In order to achieve the desired result, the system of FIG. 4 serves to steer current in and out of resistive load 416 in response to signal amplitudes that exceed threshold limits in order to maintain a maximal output amplitude without clipping. Accordingly, the output amplifiers 428 are coupled to the inventive circuitry to achieve the desired output signal characteristics.

The output fluctuations from amplifiers 428 cause variations in the gate to source voltage of MOSFETs 404A and 404B. Accordingly, biasing circuitry 440 and voltage limiter circuitry 444 are operable to steer current in to and out of resistive load 416 as necessary to maintain the output voltage within limits and to compensate for signal current through resistive load 416 for the negative portion of an alternating current. Similarly, biasing circuitry 432 and voltage limiter circuitry 436 are operable to steer current in to and out of resistive load 416 as necessary to maintain the output voltage within limits and to compensate for signal current through resistive load 416 for the positive portion of an alternating current.

In operation of the described embodiment of the invention, an IF signal is received, after being down converted from RF, at inputs 420 where they are produced to filters 424. Filters 424 provide the bandpass filtering. The output of filters 424 are then produced to amplifiers 428 that amplify the signal approximately 40 dB so as to have an output amplitude that reaches the specified rail voltages for the system when the input is presented with the maximum expected signal.

As has been described previously, it is desirable to amplify a given signal to the peak amplitude or rail voltage while avoiding clipping. Accordingly, the system of FIG. 4 includes biasing circuitry and voltage limitation circuitry to steer current in to and out of a reactive load MOSFET pair in a manner that enables the rail voltages to be reached while avoiding clipping in the final output stages of the amplifier system.

According to the polarity of the signal, either voltage limiter circuitry 436 or 444 will steer current in to or out of the reactive load MOSFET pair to maintain the output voltage in a predefined range near the rail voltage while avoiding clipping. The specific operation of Biasing circuitry 432 or Biasing circuitry 440 and voltage limiter circuitry 436 or 444 will be described in reference to the figures below.

Figure 5:
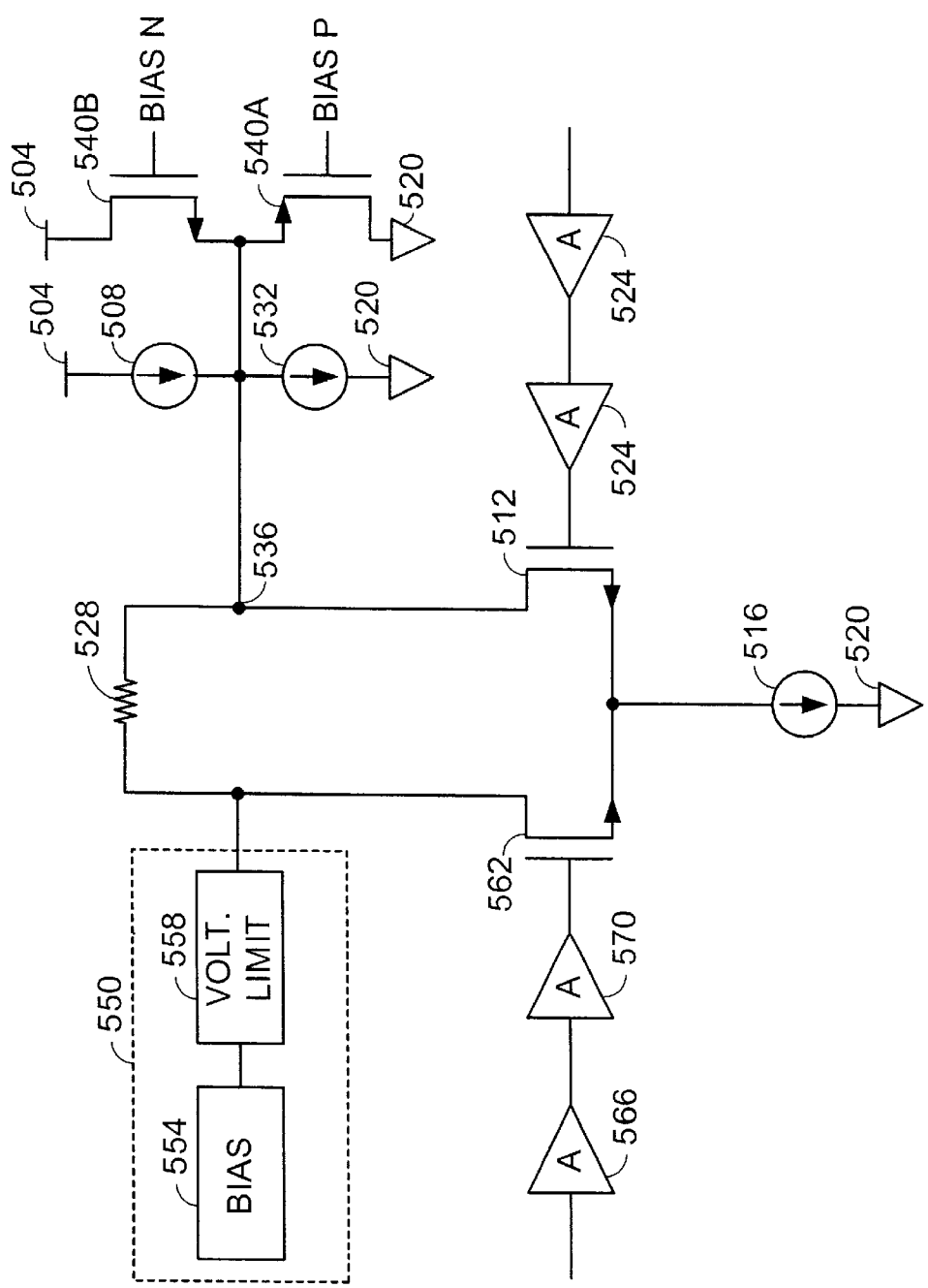
FIG. 5 is a schematic block diagram of one embodiment of the present invention.

FIG. 5 is a schematic block diagram of one embodiment of the present invention. A voltage source 504 is coupled to a constant current source 508 to produce 1 Amperes (amps) of current. The path of the current produced by current source 508 includes a MOSFET 512, a constant current drain 516 and a ground 520. MOSFET 512 further is coupled to receive an amplified voltage from a pair of amplifiers 524. In the described embodiment of the invention, each of the amplifiers 524 provides 20 dB of gain.

The path of the current from current source 508 further includes a resistive load 528 and a current drain 532, both of which are coupled to a node 536. Current drains 516 and 532 drain a constant current amount of I and I/2 (one half of the current produced by current source 508), respectively. Accordingly, with equal voltage inputs, the current through MOSFETs 562 and 512 would be equal and voltage across resistive load 528 would be zero. The fluctuations from amplifiers 524, however, cause the voltage across resistive load 528 to fluctuate.

Accordingly, a pair of MOSFETs (PMOS and NMOS) 540A and 540B are also coupled to node 536 to steer current in to or out of node 536 in response to the gate to source voltage fluctuations across MOSFET 512. Generally, each of the MOSFETs 540A and B is biased to turn on at a specified bias voltage level to steer current either into or out of the resistive load 528.

Continuing to refer to FIG. 5, the circuitry delineated as 550 is for performing similar processing as described above for steering current in to and out of resistive load 528 for an opposite portion of the alternating cycle of a signal in contrast to the cycle portion for the circuitry described above. More specifically, circuitry 550 includes biasing circuitry 554 for providing bias signals to voltage limiter circuitry 558 to set the turn on points or voltages. Circuitry 550 steers current in to and out of resistive load 528 according to voltage fluctuations over the gate to source junction of MOSFET 562 that are produced by amplifiers 566 and 570.

Figure 6:
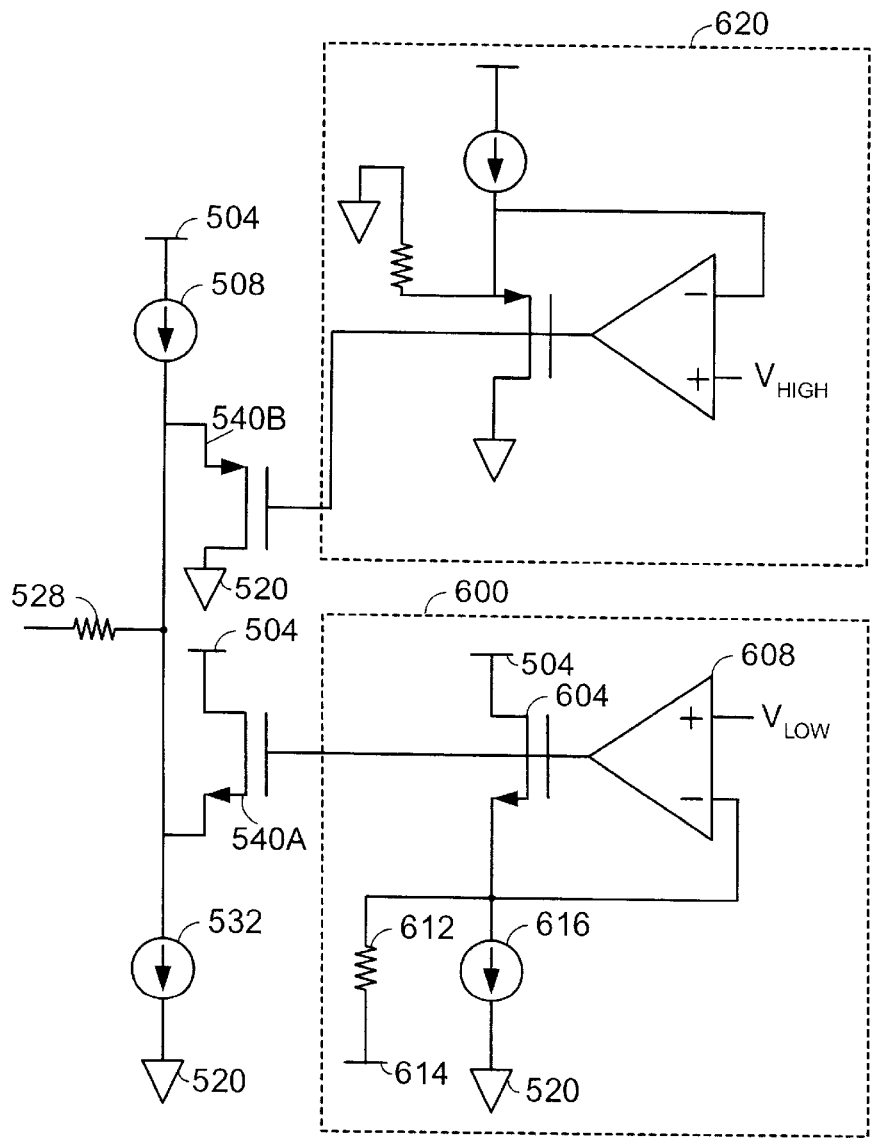
FIG. 6 is a functional schematic block diagram of a biasing circuit formed according to one embodiment of the invention.

FIG. 6 is a functional schematic block diagram of a biasing circuit formed according to one embodiment of the invention. Biasing circuitry 600 is coupled to some of the circuit elements of FIG. 5 and, more particularly, to MOSFET 540A. Biasing circuitry 600 provides a bias voltage (the desired rail voltage) to prompt MOSFET 540A to turn on once its gate to source voltage equals the gate to source voltage of a MOSFET 604. MOSFET 604 gate to source voltage is determined by a replica resistive load 612 so that current may be steered in to and away from resistive load 528. Replica resistive load 612 is matched to resistive load 528 and functionally matches the current lost in the resistive load 528. As may be seen, resistive load 612 is terminated into a reference node 614.

Current steering MOSFET 540A is coupled to biasing circuitry 600 while MOSFET 540B is coupled to biasing circuitry 620. As may be seen, biasing circuitry 600 includes an n-channel MOSFET 604 that is coupled to voltage source 504 at the drain terminal (or the source terminal depending upon the configuration). The gate of MOSFET 604 is coupled to receive a differentially amplified voltage from a differential amplifier 608. Here, the positive input of differential amplifier 608 is coupled to a reference voltage $V_{LOW}$ while the negative input is coupled to replica resistive load 612, a current drain 616 and the source of MOSFET 604.

Biasing circuitry 600 includes circuit components that are a mirror of other circuit components described in FIGS. 4 and 5. For example, replica resistive load 612 is a resistor that is matched to resistive load 528. In the described embodiment of the invention, both replica resistor 612 and resistive load are external and are coupled to the remaining components of biasing circuitry 600. For the biasing circuitry 600 to operate properly, however, the resistive load 612 and 528 should be matched regardless of whether formed on or off chip. Similarly, current drain 616 is matched to current drain 532. Finally, MOSFET 604 is matched to MOSFET 540A.

While it is theoretically possible to merely define a turn on voltage that is applied to the gate terminal of the current steering MOSFETs, such an would not provide for manufacturing variations and component tolerances. Accordingly, a high level of precision may be obtained with good luck but not with good design. Using the disclosed design with matched components that vary in tolerance in a consistent manner therefore allows for precise regulation and current steering.

Thus, the matched components are operable to increase or reduce current in matching MOSFET 540A with precision. The reference voltage input at the positive input of differential amplifier 608 sets the rail voltage level wherein the response of the matched components of biasing circuitry 600 mirrors the response of the corresponding components in the circuitry shown in FIGS. 4 and 5. Thus, by using these matched components, the turn on voltages may be precisely maintained notwithstanding variations from fabrication. Thus, biasing circuit 600 sets a set point that causes current steering MOSFET 540A to turn on to inject current into resistive load 528 whenever a signal level at the source of current steering MOSFET 540A falls below a specified level.

Biasing circuitry 620, which is coupled to current steering MOSFET 540B includes a p-channel MOSFET formed to match p-channel current steering MOSFET 540B. As may be seen, the configuration of biasing circuit 620 is similar to that of biasing circuit 600 but modified to provide a current source in place of a current sink, a p-channel MOSFET instead of an n-channel MOSFET and receives a high reference voltage to define an upper signal level that, when the upper signal level is exceeded, prompts current steering MOSFET 540B to remove current from resistive load 528 (Note: this analysis depends on a positive charge flow convention).

While FIG. 6 illustrates the configuration and operation of only two current steering MOSFETS 540A and 540B, and two corresponding biasing circuits 600 and 620, respectively, it is understood that the circuitry shown is only of one side of a differential amplifier for simplicity. The inventive circuitry includes current steering MOSFETS and biasing circuitry as shown in FIG. 6 for a second side of the differential amplifier as well.

Figure 7:
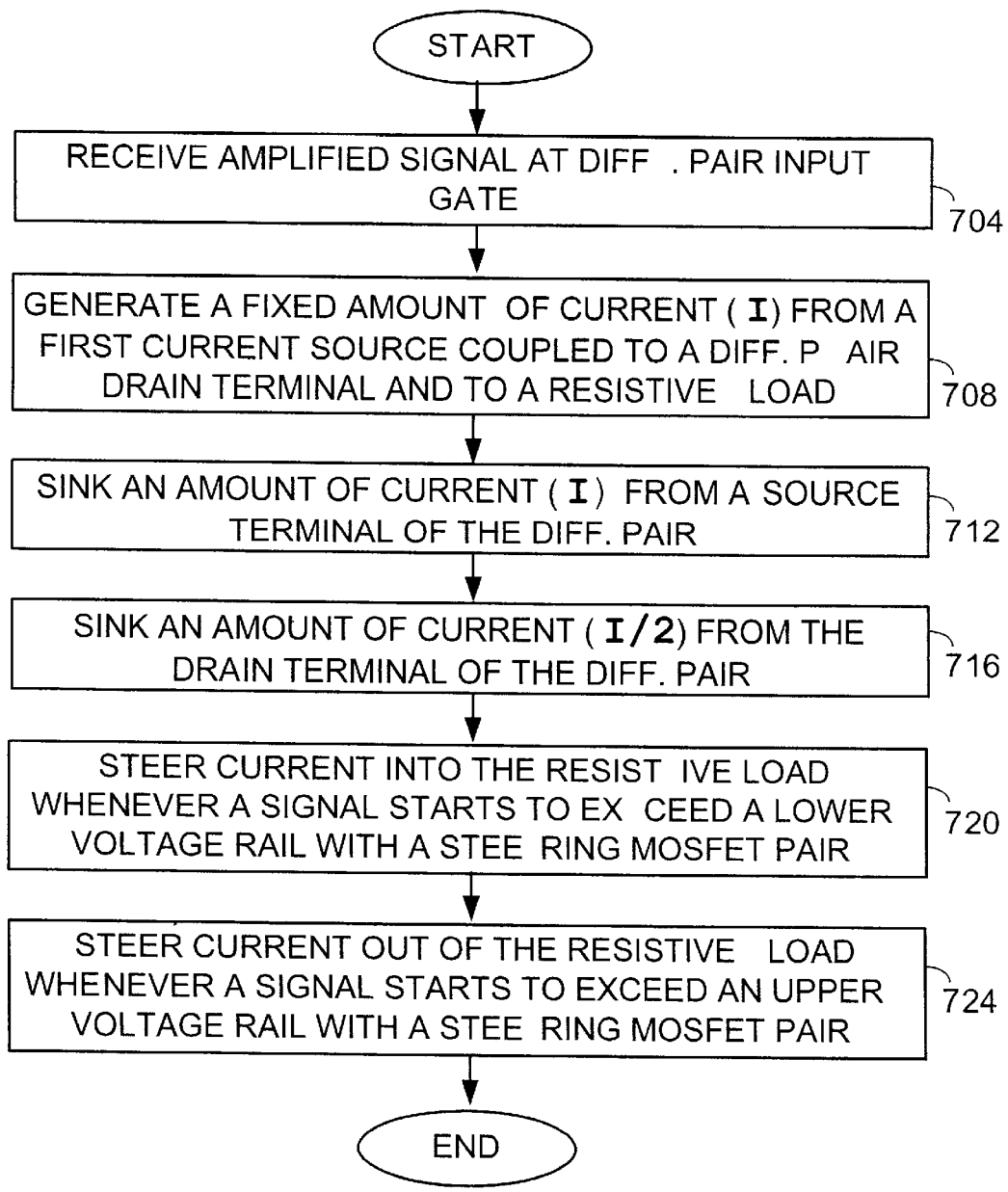
FIG. 7 is a flow chart of the method for steering current into and out of the resistive load to avoid signal clipping according to one embodiment of the present invention.

FIG. 7 is a flow chart of the method for steering current in to and out of the resistive load to avoid signal clipping according to one embodiment of the present invention. An amplified signal is received at the input to the gate of a differential pair (step 704). A fixed amount of current, "I", is generated from a first current source to a node that is coupled to the differential pair drain terminal and a resistive load (step 708). The source terminal of the differential pair is coupled to a first current sink formed to sink a fixed amount of current represented by "I" (step 712). The drain terminal of the differential pair is coupled to a second current sink designed to sink a fixed amount of current represented by "I/2" (step 716).

The steps described above relate to steady state conditions while the differential circuit is electrically balanced. When the signal in the resistive load drops below a lower voltage rail, however, a first steering MOSFET pair will steer current into the resistive load to raise the signal level above the lower rail voltage (step 720). Upon the receipt of a sufficiently large signal to the gate of the differential pair, the signal voltage in the resistive load will tend to rise above or approach an upper voltage rail. Under such conditions, a second steering MOSFET pair will steer current out of the resistive load to lower the signal voltage below the upper voltage rail (step 724).

Figure 8:
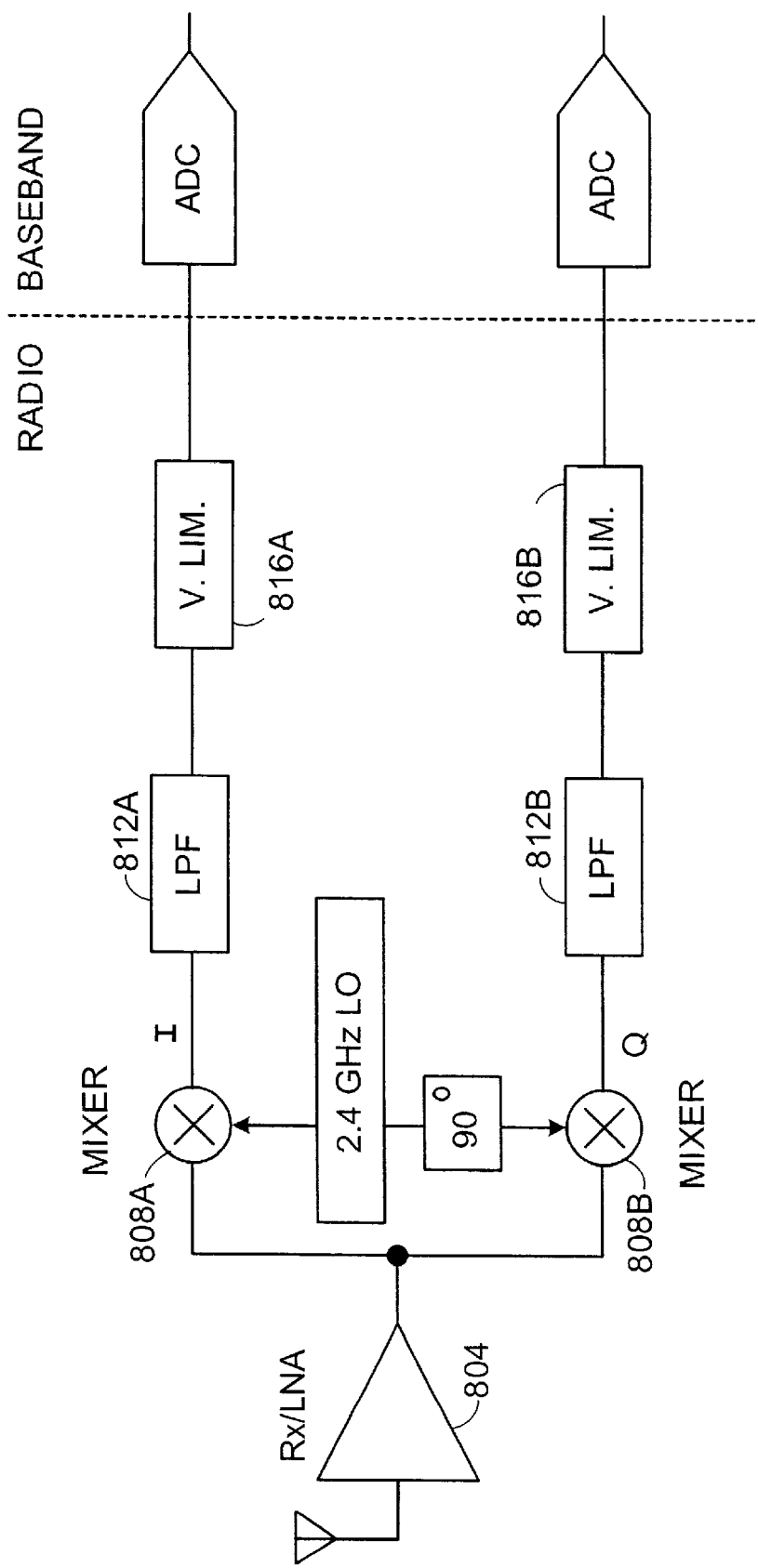
FIG. 8 is a functional schematic block diagram of an RF processing unit of a radio transceiver formed according to one embodiment of the present invention.

FIG. 8 is a functional schematic block diagram of an RF processing unit of a radio transceiver formed according to one embodiment of the present invention. An RF receiver unit initially receives a radio frequency signal at a receiver/low noise amplifier (LNA) 804 that is coupled to receive wireless communications by way of an antenna. As is known by those of average skill in the art, radio communications typically employ one of many different modulation techniques, including Quadrature Phase Shift Keying (QPSK). In the described embodiment, QPSK modulation is utilized. Accordingly, receiver/LNA 804 produces I and Q branches for processing. The signals in the I and Q branches are identical except that they are out of phase by 90°. Within each of the I and Q branches, the signal is produced to a mixer and local oscillator that down converts the received signal from radio frequencies to a baseband channel.

In the described embodiment of the invention, the radio transceiver is formed to satisfy Bluetooth design requirements (although it could readily be utilized for other systems such as 802.11b standard protocol systems. The input signal is tuned to a 2.4 GHz frequency of oscillation and then is down converted to baseband frequencies for processing. More specifically, the I channel is produced from receiver/LNA 804 to a mixer 808A and the Q channel is produced to a mixer 808B. Mixers 808A and 808B receive the signal at a frequency of 2.4 GHz and then down convert the received signals to baseband freqeuncies. Thereafter, mixers 808A and 808B produce the down converted signal to a low pass filter 812A and a low pass filter 812B for the I and Q channels, respectively.

As is known, low pass filters 812A and 812B are for blocking all communication signals above a specified frequency. The outputs of low pass filters 812A and 812B are then produced to voltage limiter circuits 816A and 816B where they are amplified to a specified level without clipping the signal. The outputs of voltage limiter circuits 816A and 816B are then provided to analog-to-digital converters (ADCs). In the described embodiment, the analog-to-digital converters (ADCs) are within the baseband processing circuitry external to the IF radio integrated circuit.

In operation, the low noise amplifier from the receiver portion of a radio transceiver, receives a wireless communication signal from an antenna and amplifies the signal, as well as split it out into the I and Q channels of the circuitry. For the sake of simplicity, the I channel will be described herein. The communication signals on the I channel are then produced to mixer 808A that adjusts the frequency of the received signals or communication channel to a specified frequency. Here, because the receiver is an 802.11b receiver, the frequency channel for the received RF signals is centered about 2.4 GHz. Thereafter, the signal is down converted to a baseband channel that is approximate to DC (e.g., 5 MHz) relative to the received RF. The baseband channel is then produced to low pass filter 812A that defines an upper corner frequency and filters (attenuates) all signals above that frequency.

Each of the components in this path thus far, namely, receiver/LNA 804, mixer 808A, and low pass filter 812A, add gain to the received signals. Because the gain of the received signal can vary dramatically, however, the gain of the voltage limiter circuits is adjusted so that the gain of the output signal being provided to the baseband radio circuitry is of a constant level. The described embodiment of the invention includes circuitry to provide maximum amplification, despite input gain level fluctuations, to a rail voltage level without clipping the signal and to adjust the output gain to account of minor fluctuations and to provide total amount of gain that is constant.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. A voltage limiter circuit for limiting voltage across a load, comprising:

first and second current steering circuits;

a first current sink;

first and second transistors of a differential amplifier, each having a first input terminal coupled to receive an amplified output from a pair of operational amplifiers, a first output terminal coupled to the first current sink and a second input terminal coupled first and second current steering circuits;

the load coupled to the first and second current steering circuits and also coupled to the second input terminals of the first and second transistors; and wherein the first and second transistors of the differential amplifier generate a primary current for defining an output voltage across the load responsive to the amplified outputs received from the pair of operational amplifiers and wherein the first and second current steering circuits sink and source current from and to the load responsive to output voltage to prevent clipping.

2. The voltage limiter circuit of claim 1 wherein the first and second current steering circuits generate a first biasing signal that defines an upper rail voltage level.

3. The voltage limiter circuit of claim 1 wherein the first and second current steering circuits generate a second biasing signal that defines a lower rail voltage level.

4. The voltage limiter circuit of claim 1 wherein the first and second current steering circuits include a bias circuit for generating first and second bias signals defining upper and lower voltage rail levels and voltage limiter circuitry for sinking and sources current from and into the load responsive the first and second bias signals and to the output voltage.

5. The voltage limiter circuit of claim 1 wherein the bias circuits of the first and second current steering circuits each include a current source coupled to source current into the load, a current sink for sinking current from the load.

6. A method for limiting an output signal to a rail voltage without clipping, comprising:

receiving a signal having an amplitude that is approximately equal to a specified rail voltage;

generating an amount of current from a current source;

sinking an amount of current that equals one half of the amount of current generated by the current source;

steering current in and out of a resistive load coupled to a node that is further coupled to the current source so that an amplitude of a signal across the resistive load does not exceed a specified rail voltage magnitude.

7. The method of claim 6 wherein the current is steered out of the resistive load to prevent clipping on a first half of a signal cycle.

8. The method of claim 1 wherein the current is steered in to the resistive load to prevent clipping on a second half of a signal cycle.

9. A method in a circuit coupled to a resistive load, comprising:

generating first and second bias signals defining upper and lower rail signal levels;

adding current to the node coupled to a load to maintain a voltage drop over the load to prevent the voltage from exceeding the lower rail signal level; and sinking current from the node to maintain a voltage drop over the load to prevent the voltage from exceeding the upper rail signal level.

10. A voltage limiter circuit, comprising:

a differential amplifier further including first and a second amplification transistors, the first and second amplification transistors further including first input terminals;

a plurality of current steering transistors coupled to the first input terminals of the first and second amplification transistors, the plurality of current steering transistors for sinking current from and sourcing current into the first input terminals of the first and second amplification transistors; and a plurality of biasing circuits for defining voltage rail levels used to bias the plurality of current steering transistors, the plurality of biasing circuits producing bias signals to the plurality of current steering transistors.

11. The voltage limiter circuit of claim 10 wherein each biasing circuit further includes a resistive load that is matched to an output resistive load.

12. The voltage limiter circuit of claim 11 further including first and second current sinks coupled to the output resistive load.

13. The voltage limiter circuit of claim 12 wherein each biasing circuit further includes a one of a current sink or a current source formed to match the first and second current sinks in terms current sink or source magnitude.

14. The voltage limiter of claim 13 wherein the current sinks and sources of the biasing circuits are formed with components that match components formed within the first and second current sinks.

* * * * *